United States Patent
Yang et al.

(10) Patent No.: US 7,687,395 B2
(45) Date of Patent: Mar. 30, 2010

(54) CONTACT APERTURE AND CONTACT VIA WITH STEPPED SIDEWALL AND METHODS FOR FABRICATION THEREOF

(75) Inventors: Haining Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 11/555,801

(22) Filed: Nov. 2, 2006

(65) Prior Publication Data

US 2008/0122110 A1 May 29, 2008

(51) Int. Cl.
*H01L 21/4763* (2006.01)
(52) U.S. Cl. .................. 438/638; 438/640; 438/672; 438/673; 257/E21.577; 257/E21.578; 257/E21.585
(58) Field of Classification Search .......... 438/630, 438/673
See application file for complete search history.

(56) References Cited

U.S. PATENT DOCUMENTS

| 6,348,709 | B1 * | 2/2002 | Graettinger et al. | 257/311 |
| 2003/0219973 | A1 * | 11/2003 | Townsend et al. | 438/631 |
| 2004/0009436 | A1 * | 1/2004 | Lee et al. | 430/313 |
| 2005/0255696 | A1 * | 11/2005 | Makiyama et al. | 438/637 |
| 2006/0228883 | A1 * | 10/2006 | Happ | 438/637 |

OTHER PUBLICATIONS

Terai, et al., "Newly developed RELACS process and materials for 65nm node device and beyond", 2005 International Microprocesses and Nanotechnology Conference, Oct. 25-28, 2005, pp. 20-21.

* cited by examiner

*Primary Examiner*—Savitri Mulpuri
*Assistant Examiner*—Cheung Lee
(74) *Attorney, Agent, or Firm*—Scully, Scott, Murphy & Presser, P.C.; H. Daniel Schnurmann

(57) ABSTRACT

A semiconductor structure includes a semiconductor device including a contact region. The semiconductor structure also includes a passivation layer passivating the semiconductor device including the contact region. A narrow bottomed stepped sidewall contact aperture is located within the passivation layer to expose the contact region. A corresponding narrow bottomed stepped sidewall contact via is located within the narrow bottomed stepped sidewall contact aperture to contact the contact region. The narrow bottomed stepped sidewall contact aperture and contact via provide for improved contact to the contact region and reduced parasitic capacitance with respect to the semiconductor device. Methods for fabricating the narrow bottomed stepped sidewall contact aperture use a mask layer (either dimensionally diminished or dimensionally augmented) in conjunction with a two step etch method.

11 Claims, 9 Drawing Sheets

CONTACT APERTURE AND CONTACT VIA WITH STEPPED SIDEWALL AND METHODS FOR FABRICATION THEREOF

BACKGROUND OF THE INVENTION

1. Field of the Invention

The invention relates generally to contact apertures and contact vias within semiconductor structures. More particularly, the invention relates to enhanced performance contact apertures and contact vias within semiconductor structures.

2. Description of the Related Art

Beyond transistors, resistors, diodes and capacitors, semiconductor circuits also include conductor contact layers and conductor interconnect layers that are separated by dielectric layers. The conductor contact layers and conductor interconnect layers are used for connection and interconnection of semiconductor devices within semiconductor circuits. In particular, conductor contact layers are also generally known as contact vias. Contact vias are intended for contact to contact regions within active devices and passive devices, such as semiconductor devices, within the semiconductor circuits. To that end, contact vias are fitted into contact apertures within the dielectric layers.

When fitting contact vias into contact apertures within dielectric layers that in turn passivate semiconductor devices within semiconductor structures, often the contact vias are misaligned with respect to the contact regions. Such misalignment may lead to compromise of performance of the semiconductor devices within the semiconductor structures.

Various semiconductor structures having desirable properties, and methods for fabricating the semiconductor structures, are known in the semiconductor fabrication art.

For example, Terai et al., in "Newly developed RELACS process and materials for 65 nm node device and beyond," 2005 International Microprocesses and Nanotechnology Conference, Oct. 25-28, 2005, pp. 20-21, teaches a resolution enhancement lithography assisted by chemical shrink (RELACS) method that utilizes a different crosslinking material for chemically shrinking a feature defined within a polyhydroxystyrene based photoresist material that is exposed using a krypton-fluoride (KrF) laser apparatus, in comparison with a feature exposed within a polyacrylic acid based photoresist material that is exposed using an argon-fluoride (ArF) laser apparatus.

Semiconductor device dimensions and semiconductor structure dimensions are certain to continue to decrease. Thus, desirable are semiconductor structures and methods for fabrication thereof that include contact vias fitted within contact apertures to provide semiconductor circuits with enhanced performance.

SUMMARY OF THE INVENTION

The invention includes a semiconductor structure and a plurality of methods for fabricating the semiconductor structure. The semiconductor structure includes a semiconductor device that in turn includes a contact region. The semiconductor device and the contact region are passivated by a passivation layer. A contact aperture is located within the passivation layer to access the contact region. A contact via is located within the contact aperture. The contact via and the contact aperture each have a stepped sidewall, preferably with a narrow bottom.

The plurality of methods in accordance with the invention is directed towards different methods for fabricating the narrow bottomed stepped sidewall contact aperture.

A semiconductor structure in accordance with the invention includes a device located over a substrate. The device includes a contact region. The semiconductor structure also includes a stepped sidewall contact via located to contact the contact region.

A particular method in accordance with the invention includes forming a passivation layer passivating a device formed over a substrate and including a contact region. The particular method also includes forming a narrow bottomed stepped sidewall contact aperture through the passivation layer to expose the contact region.

Another particular method in accordance with the invention includes forming a passivation layer passivating a device, including a contact region, formed over a substrate. This particular method also includes forming upon the passivation layer a mask layer having a comparatively wide aperture formed therein. This particular method also includes extending the comparatively wide aperture into the passivation layer, while using the mask layer as a first etch mask, to form an extended aperture. This particular method also includes forming a reacted material layer upon a sidewall of the mask layer to form a narrowed aperture from the extended aperture. Finally, this particular method includes further etching the passivation layer to form a narrow bottomed stepped sidewall contact aperture within the passivation layer and exposing the contact region, while using the mask layer and reacted material layer as a second etch mask.

Within the embodiments and the invention, a "narrow bottomed stepped sidewall contact aperture" and a "narrow bottomed stepped sidewall contact via" are intended as having a minimum of one step within a sidewall thereof. The resulting stepped sidewall portions of the narrow bottomed stepped sidewall contact aperture and narrow bottomed stepped sidewall contact via are also intended as coaxial.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The invention, which includes a semiconductor structure and methods for fabricating the semiconductor structure, is understood within the context of the description that follows. The description that follows is understood within the context of the drawings described above. Since the drawings are intended for illustrative purposes, the drawings are not necessarily drawn to scale.

FIG. 1 to FIG. 11 show a series of schematic cross-sectional diagrams illustrating the results of progressive stages in fabricating a semiconductor structure in accordance with a structural embodiment of the invention, while using a particular method that comprises a methodological embodiment of the invention. As will be illustrated within the context of additional disclosure below, the semiconductor structure in accordance with the structural embodiment of the invention may alternatively be fabricated using at least one other materially different particular method that comprises an additional methodological embodiment of the invention.

Figure 1:
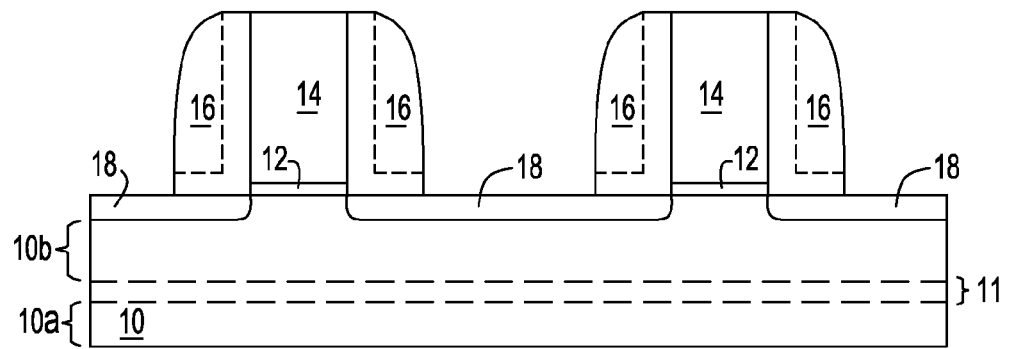
FIG. 1 to FIG. 11 show a series of schematic cross-sectional diagrams illustrating the results of progressive stages in fabricating a semiconductor structure in accordance with a structural embodiment of the invention, while using a particular method that comprises a methodological embodiment of the invention.

FIG. 1 first shows a semiconductor substrate 10. The semiconductor substrate 10 may comprise any of several semiconductor materials. Non-limiting examples include silicon, germanium, silicon-germanium alloy, silicon carbide, silicon-germanium carbide alloy and compound (i.e., III-V and II-VI) semiconductor materials. Non-limiting examples of compound semiconductor materials include gallium arsenide, indium arsenide and indium phosphide semiconductor materials. Typically, the semiconductor substrate 10 comprises a silicon or silicon-germanium alloy semiconductor material that has a thickness from about 0.5 to about 1.5 mm.

Although the instant embodiment illustrates the invention within the context of a bulk semiconductor substrate 10, the embodiments and the invention are not necessarily so limited. Rather, the embodiments and the invention also contemplate use of semiconductor substrates in the alternative of bulk semiconductor substrates.

One such alternative semiconductor substrate is a semiconductor-on-insulator substrate. Such a semiconductor-on-insulator substrate results when a base semiconductor substrate 10a portion of the semiconductor substrate 10 that is illustrated in FIG. 1 is separated from a surface semiconductor layer 10b portion of the semiconductor substrate 10 that is illustrated in FIG. 1 by an optional buried dielectric layer 11 that is also illustrated in FIG. 1.

The optional buried dielectric layer 11 may comprise any of several dielectric materials. Non-limiting examples include oxides, nitrides and oxynitrides, particularly of silicon. However, oxides, nitrides and oxynitrides of other elements are not excluded. The buried dielectric layer 11 may comprise a crystalline or a non-crystalline dielectric material, with crystalline dielectric materials being highly preferred. The buried dielectric layer 11 may be formed using any of several methods. Non-limiting examples include ion implantation methods, thermal or plasma oxidation or nitridation methods, chemical vapor deposition methods and physical vapor deposition methods. Typically, the buried dielectric layer 11 comprises an oxide of the semiconductor material from which is comprised the semiconductor substrate 10. Typically, the optional buried dielectric layer 11 has a thickness from about 50 to about 200 angstroms.

Within a semiconductor-on-insulator substrate in general, a surface semiconductor layer (such as the surface semiconductor layer 10b) and a base semiconductor substrate (such as the base semiconductor substrate 10a) may comprise the same or different semiconductor materials with respect to semiconductor materials composition, crystallographic orientation, dopant polarity and dopant concentration.

As an additional alternative semiconductor substrate to the bulk semiconductor substrate 10 that is illustrated in FIG. 1, the embodiments and the invention also contemplate use of hybrid orientation (HOT) substrates. Hybrid orientation substrates include multiple semiconductor regions having different crystallographic orientations.

Semiconductor-on-insulator substrates and hybrid orientation substrates may be fabricated using any of several methods. Non-limiting examples include lamination methods, layer transfer methods and separation by implantation of oxygen (SIMOX) methods.

FIG. 1 also shows a plurality of field effect transistor device structures located within and upon the semiconductor substrate 10. The plurality of field effect transistor device structures comprises: (1) a plurality of gate dielectrics 12 located upon the semiconductor substrate 10; (2) a plurality of gate electrodes 14 located upon the plurality of gate dielectrics 12; (3) a plurality of spacers 16 located adjoining a pair of opposite sidewalls of the gate dielectrics 12 and the gate electrodes 14, and intended as encircling the same in plan-view; and (4) a plurality of extension regions 18 located within semiconductor substrate 10 and separated by the plurality of gate electrodes 14. Each of the foregoing layers and structures may comprise materials and have dimensions that are conventional in the semiconductor fabrication art. Each of the foregoing layers and structures may also be fabricated using methods that are conventional in the semiconductor fabrication art.

The gate dielectrics 12 may comprise conventional dielectric materials such as oxides, nitrides and oxynitrides of silicon that have a dielectric constant from about 4 to about 20, measured in vacuum. Alternatively, the gate dielectrics 12 may comprise generally higher dielectric constant dielectric materials having a dielectric constant from about 20 to at least about 100. Such higher dielectric constant dielectric materials may include, but are not limited to hafnium oxides, hafnium silicates, titanium oxides, barium-strontium-titantates (BSTs) and lead-zirconate-titanates (PZTs). The gate dielectrics 12 may be formed using any of several methods that are appropriate to their materials of composition. Non-limiting examples of such methods include thermal or plasma oxidation or nitridation methods, chemical vapor deposition methods and physical vapor deposition methods. Typically, the gate dielectrics 12 comprise a thermal silicon oxide dielectric material that has a thickness from about 10 to about 70 angstroms.

The gate electrodes 14 may comprise materials including, but not limited to certain metals, metal alloys, metal nitrides and metal silicides, as well as laminates thereof and composites thereof. The gate electrodes 14 may also comprise doped polysilicon and doped polysilicon-germanium alloy materials (i.e., having a dopant concentration from about 1e18 to about 1e22 dopant atoms per cubic centimeter) and polycide materials (doped polysilicon (or alternatively polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrodes 14 comprise a doped polysilicon material that has a thickness from about 600 to about 2000 angstroms.

The spacers 16 may comprise materials including but not limited to conductor spacer materials and dielectric spacer materials. Conductor spacer materials are less common, but are nonetheless known. Dielectric spacer materials are more common. The spacer materials may be formed using any of several methods. Non-limiting examples include chemical vapor deposition methods and physical vapor deposition methods. The spacers 16 may also comprise multilayers that are illustrated in phantom within the schematic cross-sectional diagram of FIG. 1. Such multilayers typically comprise silicon oxide materials closer to the gate electrodes 14 and silicon nitride materials laminated thereto and further from the gate electrodes 14. Typically, the spacers 16 comprise at least in part a silicon oxide dielectric material.

Finally, the extension regions 18 comprise a generally conventional n or p conductivity type dopant appropriate to a polarity of a field effect transistor desired to be fabricated incident to further processing of the semiconductor structure whose schematic cross-sectional diagram is illustrated in FIG. 1. The plurality of extension regions 18 is formed using an ion implantation method. The ion implantation method uses the gate electrodes 14 absent the spacers 16 as a mask to form the extension regions 18, each of which extends beneath the spacers 18.

Figure 2:
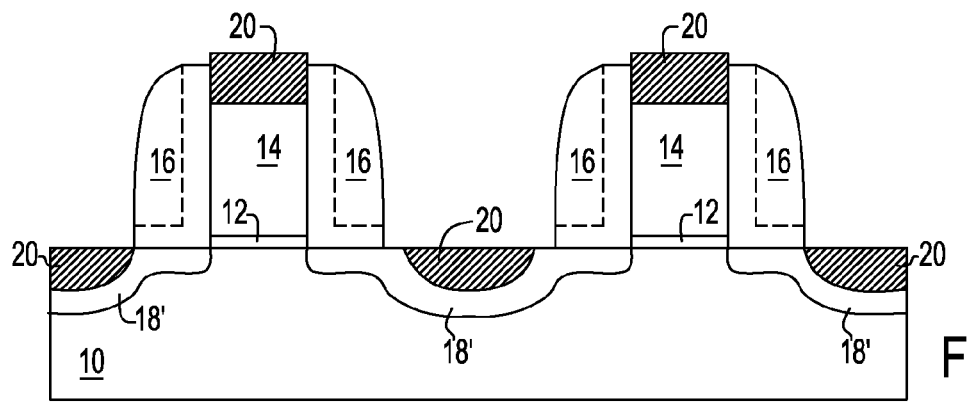

FIG. 2 first shows a plurality of source/drain regions 18' that incorporates the plurality of extension regions 18 that is illustrated in FIG. 1. The source/drain regions 18' are formed using a second ion implantation method that uses the gate electrodes 14 and the spacers 16 as a mask. The second ion implantation method typically uses a dopant having the same polarity as the first ion implantation method. Dopant levels are from about 1e19 to about 1e21 dopant atoms per cubic centimeter within each of the source/drain regions 18'. Extension regions within the source/drain regions 18' may under certain circumstances be more lightly doped than contact regions with the source/drain regions 18', although such differential doping concentrations are not a requirement of the embodiment or the invention.

FIG. 2 also shows a plurality of silicide layers 20 located upon the source/drain regions 18' and the gate electrodes 14. The silicide layers 20 may comprise any of several metal silicide forming metals. Non-limiting examples include nickel, cobalt, titanium, tungsten and vanadium metal silicide forming metals. Nickel and cobalt metal silicide forming metals are common. The silicide layers 20 may be formed using any of several methods. Although not limiting the instant embodiment or the invention, salicide methods are particularly common. Salicide methods include: (1) a blanket metal silicide forming metal layer deposition; (2) a thermal annealing of the blanket metal silicide forming metal layer to form silicide layers where the blanket metal silicide forming metal layer contacts a silicon material; and (3) a subsequent stripping of unreacted metal silicide forming metal. Typically, the silicide layers 20 comprise a cobalt metal silicide forming metal or a nickel metal silicide forming metal. Typically, the silicide layers 20 have a thickness from about 100 to about 300 angstroms.

Figure 3:
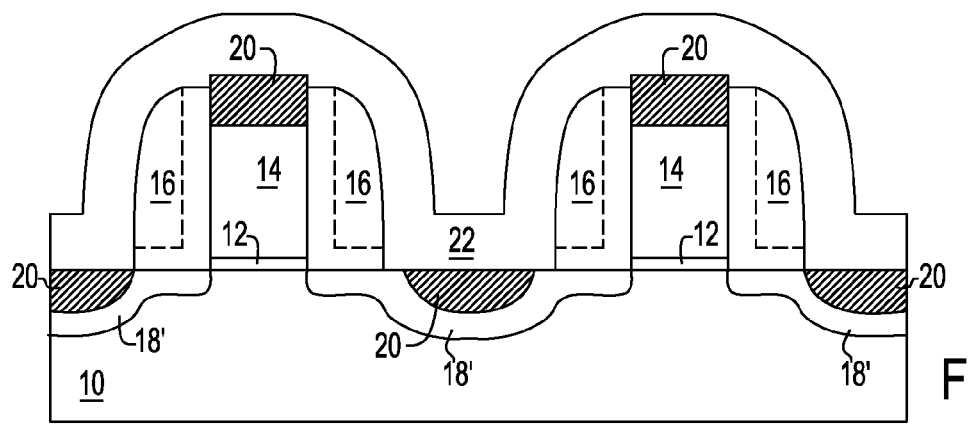

FIG. 3 shows a liner layer 22 located upon the semiconductor structure of FIG. 2. The liner layer 22 may comprise any of several liner materials, but will typically comprise a dielectric liner material. The dielectric liner material may comprise any of several dielectric materials. Non-limiting examples of dielectric materials include silicon oxide, silicon nitride and silicon oxynitride dielectric materials. Other dielectric materials, including oxides, nitrides and oxynitrides of elements other than silicon, are not excluded. In particular, silicon nitride dielectric materials are desirable for the liner layer 22 insofar as silicon nitride dielectric materials may be deposited with a variable and appropriate stress (i.e., either compressive stress or tensile stress) that may be used to stress a channel region beneath a gate electrode 14 within the semiconductor structure of FIG. 4. Such a channel region stress is known in general in the art to favorably influence charge carrier mobility within a field effect transistor.

Figure 4:
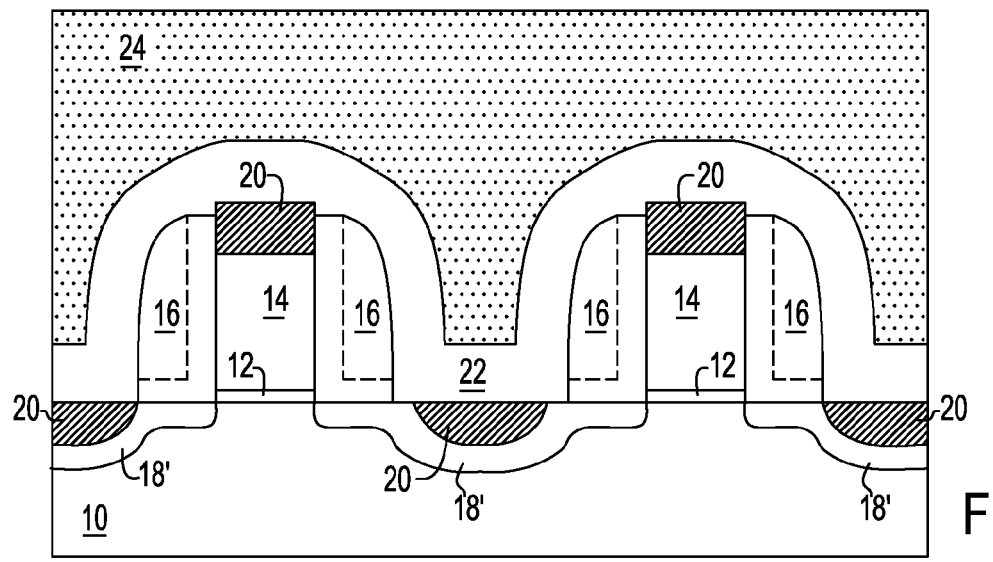

FIG. 4 shows a passivation layer 24 located upon the semiconductor structure of FIG. 3. The passivation layer 24 may comprise any of several passivation materials, and in particular the passivation layer 24 typically comprises a dielectric passivation material or a laminate of dielectric passivation materials. Generally, the passivation layer 24 will comprise at least one dielectric passivation material of composition different than the liner layer 22. Thus, when the liner layer 22 preferably comprises a stressed silicon nitride liner material, the passivation layer 24 preferably comprises a silicon oxide passivation material. Typically, the passivation layer 24 has a thickness from about 1500 to about 2500 angstroms.

Figure 5:
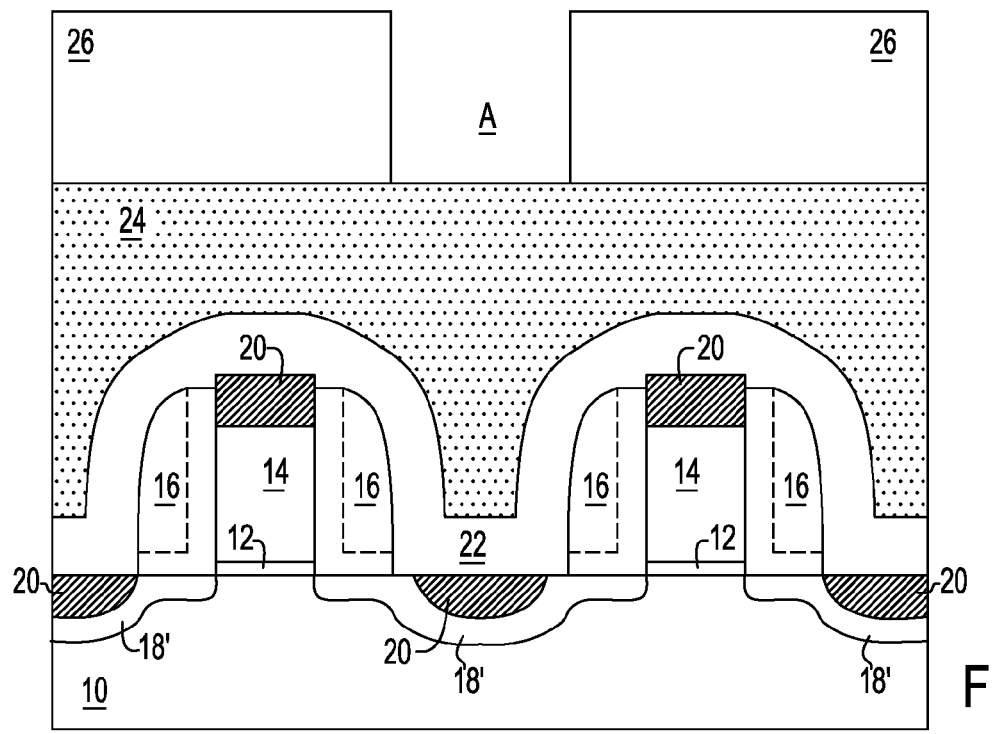

FIG. 5 shows a mask layer 26 located upon the passivation layer 24 within the semiconductor structure of FIG. 4. The mask layer 26 defines an aperture A at the bottom of which is exposed the passivation layer 24. The aperture A typically has a linewidth from about 50 to about 150 nanometers. The mask layer 26 will typically comprise a photoresist material, although the invention is not necessarily so limited. Non-limiting examples of candidate photoresist materials include positive photoresist materials, negative photoresist materials and hybrid photoresist materials. Typically, the mask layer 26 comprises a positive photoresist material or a negative photoresist material that has a thickness from about 1800 to about 3500 angstroms.

Figure 6:
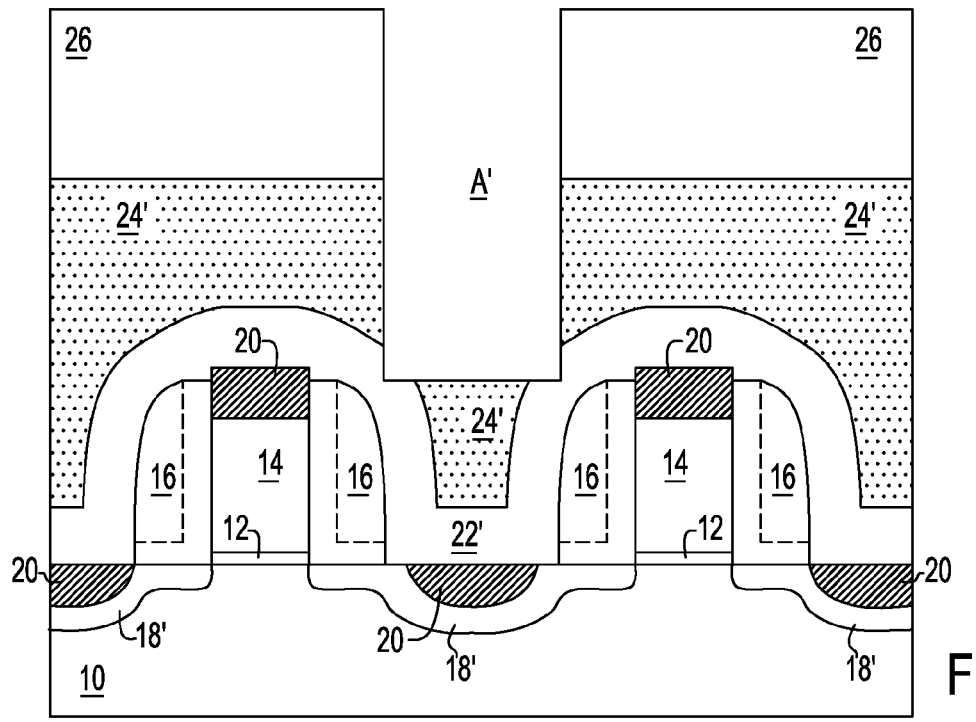

FIG. 6 shows the results of etching the passivation layer 24 to form a passivation layer 24' while using the mask layer 26 as an etch mask layer. The foregoing etching provides an extended aperture A' from the aperture A. The foregoing etching may optionally also partially etch the liner layer 22 to form a liner layer 22'. The foregoing etching may be effected using etch methods and materials that are conventional in the semiconductor fabrication art. Included but not limiting are wet chemical etch methods and materials, and dry plasma etch methods and materials. Dry plasma etch methods and materials are particularly common insofar as dry plasma etch methods and materials generally provide straight sidewalls to the passivation layer 24'. Typically dry plasma etch methods and materials use specific combinations of etchant gas compositions that include fluorine containing etchant gases. Typically, the passivation layer 24 is etched to form the passivation layer 24' to a distance so that the liner layer 22 is either completely unetched, or alternatively minimally etched to form the liner layer 22'.

Figure 7:
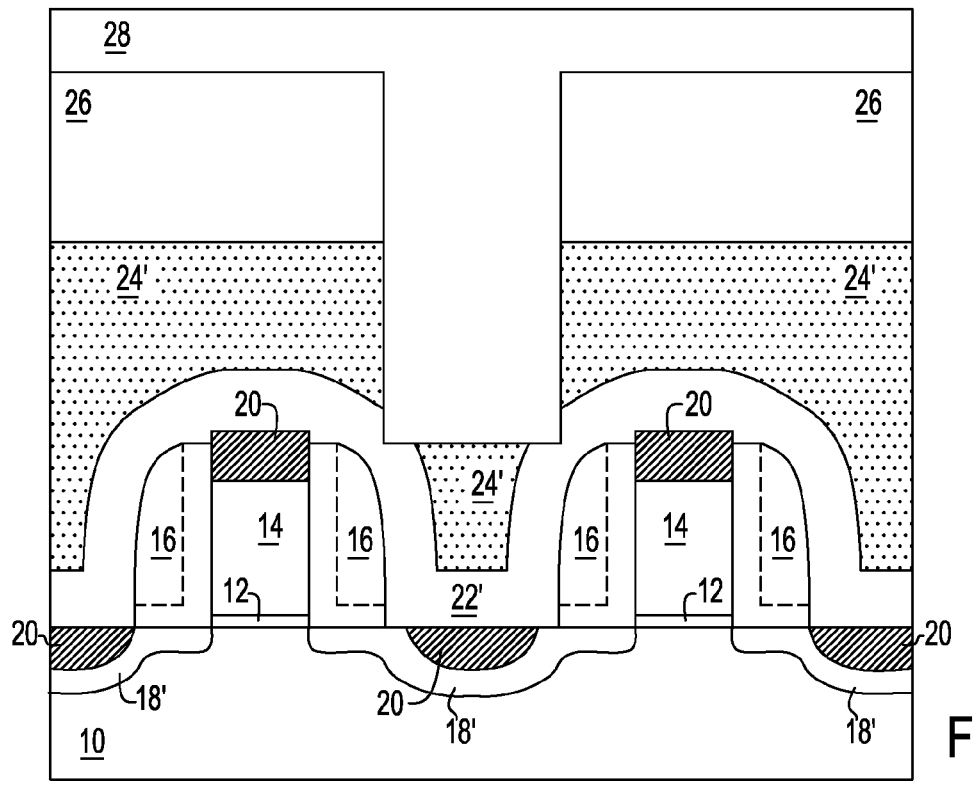

FIG. 7 shows a reactive material layer 28 located upon the semiconductor structure of FIG. 6 and in particular filling the extended aperture A'. The reactive material layer 28 is intended as comprising a reactive material that has a chemical functionality so as to react with the chemical functionality that is included within the mask material which comprises the mask layer 26. Particular chemical functionality from which may be comprised the reactive material that comprises the reactive material layer 28 includes hydroxyl functionality and amine functionality when the mask layer 26 comprises a photoresist material that includes an organic acid functionality. An example of such reactive materials commercially available is called RELACS provided by AZ Electronic Materials. A reverse ordering of the foregoing materials for the mask layer 26 and the reactive material layer 28 is also within the context of the instant embodiment. Other chemical functionalities and chemical functionality pairs are not excluded.

Figure 8:
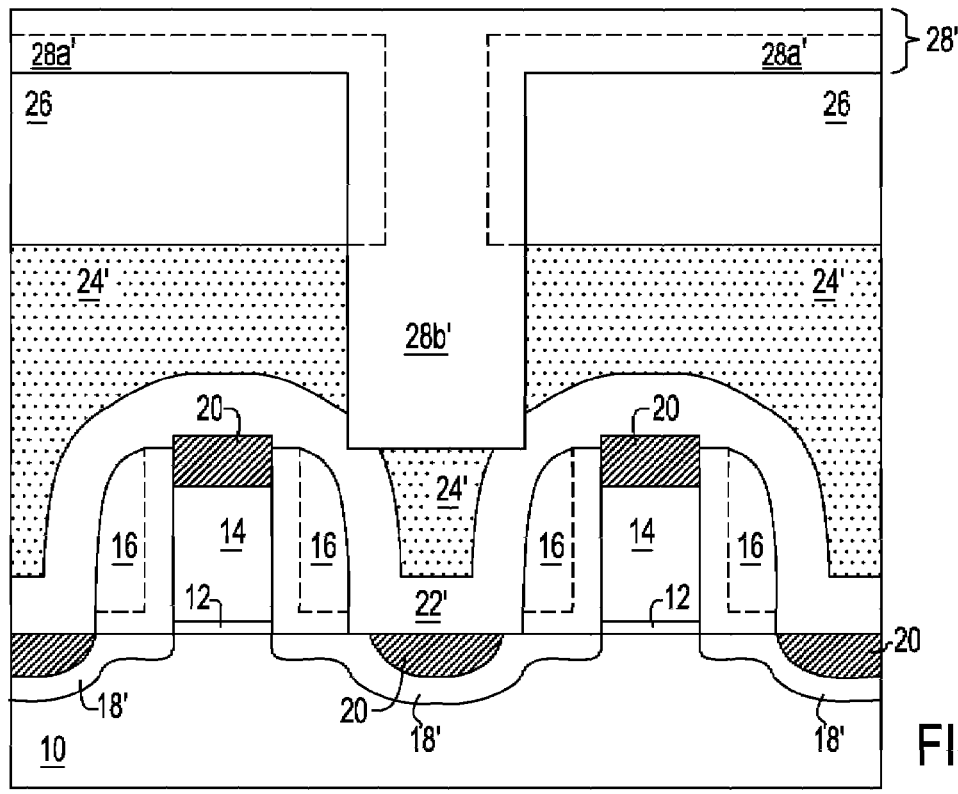

FIG. 8 shows the results of reacting the reactive material layer 28 with the mask layer 26 to form a partially reacted reactive material layer 28'. The partially reacted reactive material layer 28' includes a reacted material layer 28a' (i.e., illustrated by phantom lines) that adjoins the mask layer 26. Also included is an unreacted portion 28b' of the reactive material layer 28. The partially reacted reactive material layer 28' may derive from reaction of the reactive material layer 28 with the mask layer 26 incident to any of several types of activation. Non-limiting types of activation include thermal activation and photo activation. Typically, the reacted material layer 28a' (i.e., enclosed by the phantom lines) has a thickness from about 50 to about 400 angstroms when the reactive material layer 28 is thermally annealed in the presence of the mask layer 26 at a temperature from about 120 to about 150 degrees centigrade for a time period from about 1 to about 3 minutes.

Figure 9:
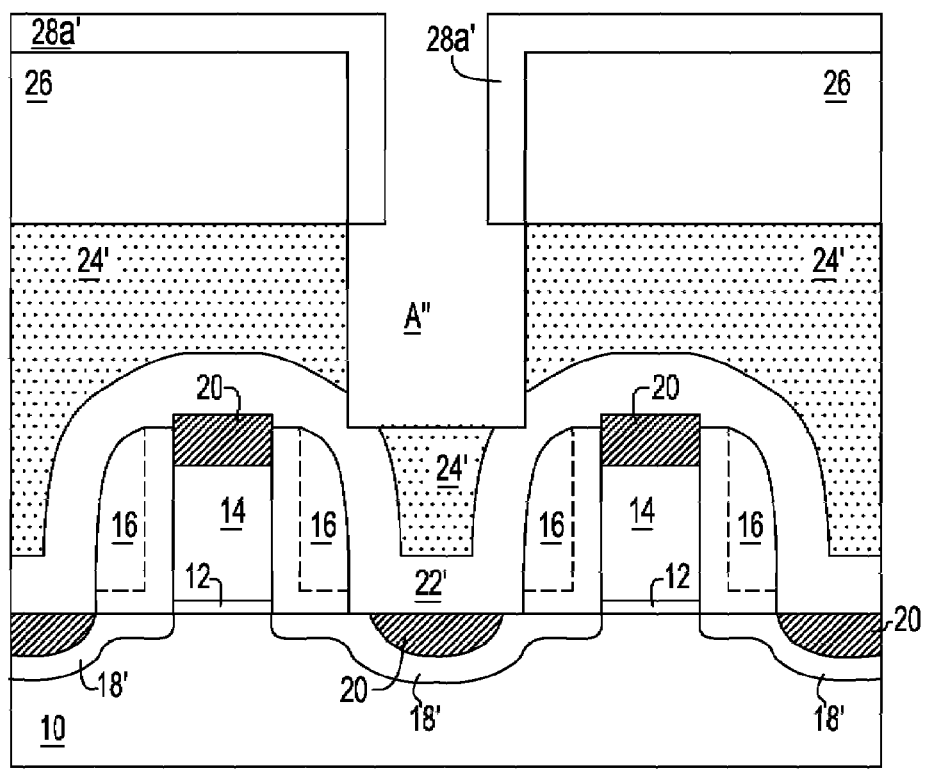

FIG. 9 shows the results of stripping unreacted portions of the partially reacted reactive material layer 28' from the semiconductor structure of FIG. 8 to leave remaining the reacted material layer 28a'. The reacted material layer 28a' adjoins and laterally dimensionally augments portions of the mask layer 26. Thus, a coaxial narrowed aperture A" is formed from the elongated aperture A' that is illustrated in FIG. 6. In accordance with disclosure above, the reacted material layer 28a' typically has a thickness from about 0.1 to about 0.5 microns. The partially reacted reactive material layer 28' may be effectively developed to form the reacted material layer 28a' while using methods that are generally conventional in the semiconductor fabrication art. Such methods may be similar to the methods that are used for forming the mask layer 26 from a blanket precursor mask material layer, when the mask layer 26 comprises a photoresist material.

Figure 10:
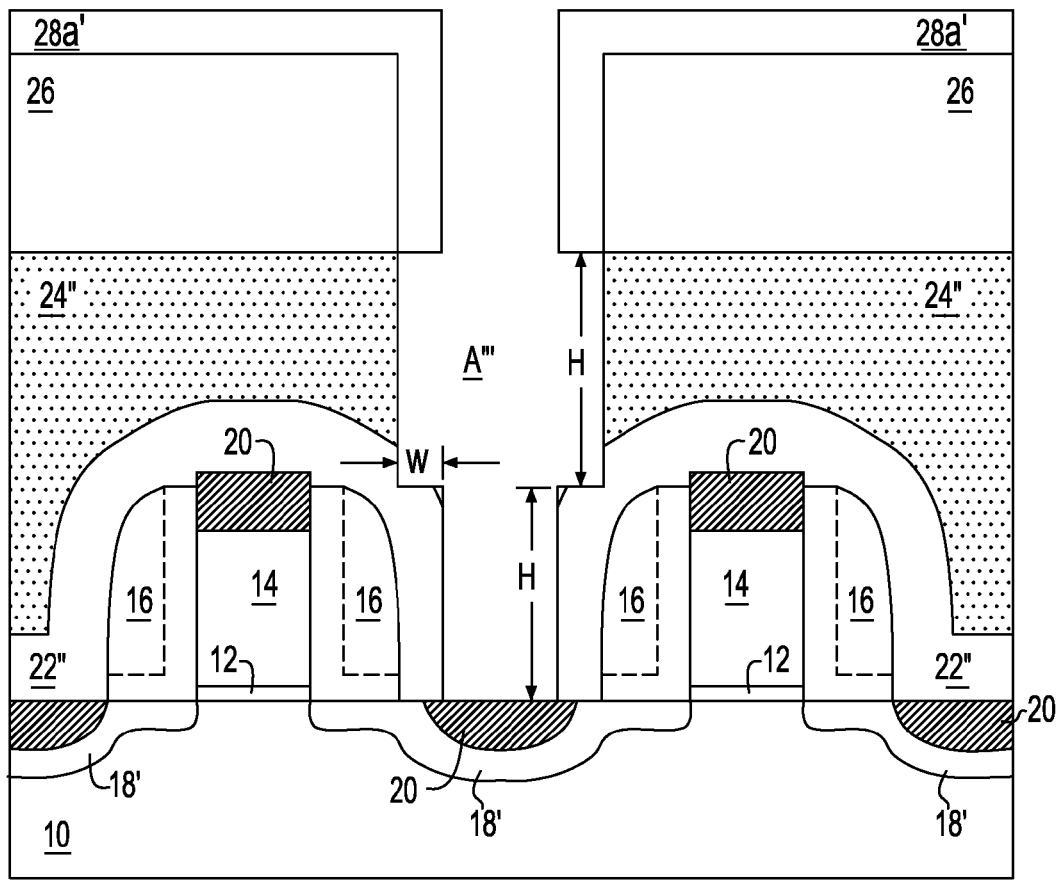

FIG. 10 shows the results of further etching the passivation layer 24' to form a passivation layer 24", and further etching the liner layer 22' to form a liner layer 22", while using the mask layer 26 and the reacted material layer 28a' as second etch mask. As a result of this further etching, a further elongated aperture A'" is formed from the narrowed aperture A". The foregoing etching may use etch methods and materials that are analogous, equivalent or identical to the etch methods and materials that are used to form the passivation layer 24' from the passivation layer 24 and the liner layer 22' from the liner layer 22, as is illustrated in FIG. 6.

As a result of the foregoing etching, a narrow bottomed stepped sidewall contact aperture is formed bounded by the passivation layer 24" and the liner layer 22" (i.e., absent the mask layer 26 and the reacted material layer 28a'). The narrow bottomed stepped sidewall contact aperture exposes a central of the silicide layers 20 that serves as a contact region within a device (i.e., a pair of field effect transistors that share the central silicide layer 30) that is illustrated in FIG. 10. As is illustrated in FIG. 10, a horizontal step width W within the narrow bottomed stepped sidewall contact aperture has a distance from about 5 to about 30 nanometers. Corresponding upper or lower vertical step heights H range from about 30 to about 150 nanometers.

Figure 11:
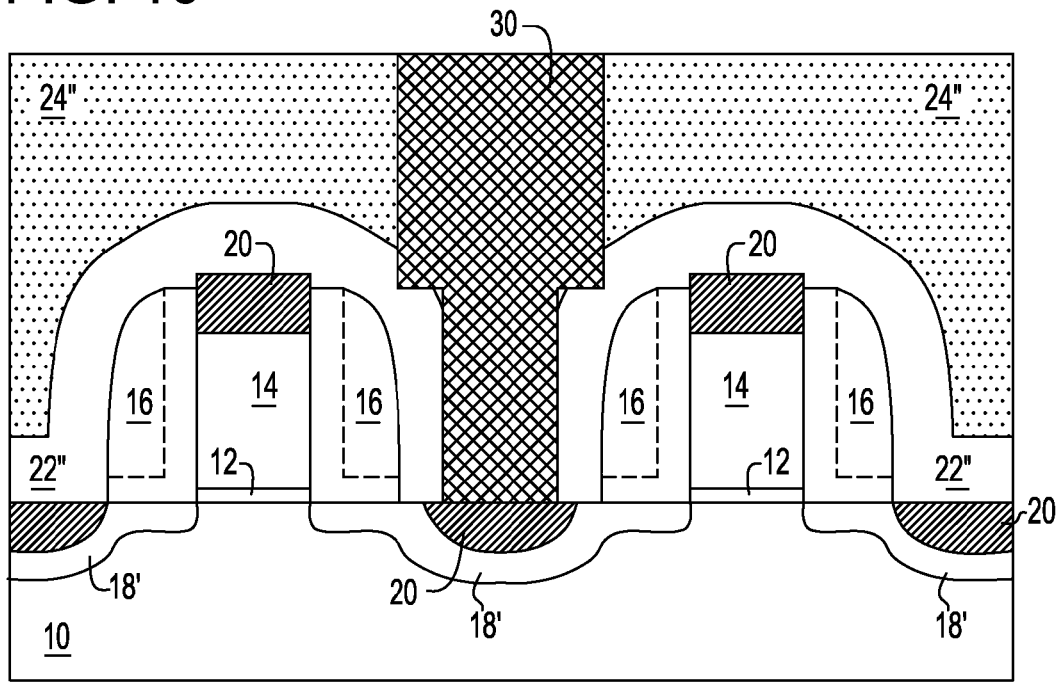

FIG. 11 shows a narrow bottomed stepped sidewall contact via 30 located within the narrow bottomed stepped sidewall contact aperture. The narrow bottomed stepped sidewall contact via 30 may comprise any of several conductor contact materials. Non-limiting examples include any of several metal, metal alloy, metal nitride and metal silicide conductor contact materials. Also included are doped polysilicon (i.e., having a dopant concentration from about 1E18 to about 1E21 dopant atoms per cubic centimeter) and polycide (i.e., doped polysilicon/metal silicide stack) conductor contact materials. Metal conductor contact materials such as tungsten, copper, aluminum and titanium materials are common. Other conductor contact materials are not excluded.

Typically, the narrow bottomed stepped sidewall contact via 30 is formed into the narrow bottomed stepped sidewall contact aperture while using a damascene method. The damascene method uses a blanket conductor contact material layer deposition and subsequent planarization to the level of the passivation layer 24". Both etch back planarization methods and chemical mechanical polish planarization methods are known. Other planarization methods are not excluded. Chemical mechanical polish planarization methods are typically most common.

FIG. 11 shows a semiconductor structure in accordance with a structural embodiment of the invention. The semiconductor structure is formed using a particular sequence of process steps within a particular methodological embodiment of the invention that is illustrated in accordance with FIG. 1 to FIG. 11. The semiconductor structure includes a narrow bottomed stepped sidewall contact aperture having a corresponding narrow bottomed stepped sidewall contact via 30 located therein. The narrow bottomed stepped sidewall contact aperture and the narrow bottomed stepped sidewall contact via 30 provide value within the context of the instant embodiment. In particular, the narrow bottomed stepped sidewall contact aperture and the narrow bottomed stepped sidewall contact via 30 provide improved alignment to a contact region (i.e., silicide layer 20) within a device, thus providing more uniform electrical characteristics to the semiconductor structure of FIG. 11. The narrow bottomed stepped sidewall contact aperture and the narrow bottomed stepped sidewall contact via 30 also provide for inhibited intrusion into the liner layer 22". Such limited intrusion is desirable under circumstances where the liner layer 22" is physically and mechanically stressed, so that a desirable stress within the liner layer 22" is not dissipated. Finally, the narrow bottomed stepped sidewall contact aperture and the narrow bottomed stepped sidewall contact via 30 also provide for a reduced parasitic capacitance of the narrow bottomed stepped sidewall contact via 30 with respect to the gate electrodes 14.

The semiconductor structure of FIG. 11 is fabricated using a method that includes use of a mask layer 26 (as illustrated in FIG. 5 to FIG. 10 and typically comprising a photoresist material) that is used in conjunction with a two step etch method, with and without a reacted material layer 28a' that is illustrated in FIG. 8 to FIG. 10. The two step etch method provides coaxial stepped sidewall portions of the narrow bottomed stepped sidewall contact aperture.

The particular foregoing methodological embodiment provides that the reacted material layer 28a' (as illustrated in FIG. 10) is located and formed self-aligned to the mask layer 26 (as illustrated in FIG. 10) so that the narrow bottomed stepped sidewall contact aperture portions are located and formed coaxially. The narrow bottomed stepped sidewall contact aperture may comprise plan-view co-axial circular sidewall steps or plan-view coaxial sidewall steps of other geometries.

Figure 12:
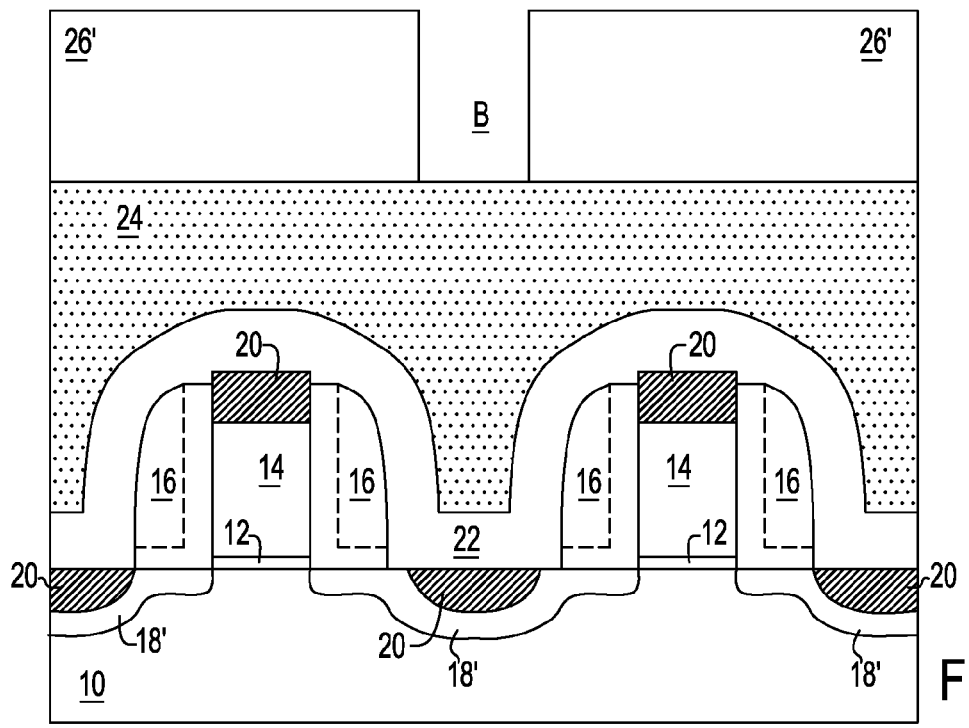
FIG. 12 to FIG. 15 show a series of schematic cross-sectional diagrams illustrating the results of progressive stages in fabricating the semiconductor structure in accordance with the structural embodiment of the invention, while using another particular method that comprises another methodological embodiment of the invention.

FIG. 12 to FIG. 15 illustrate the results of progressive stages in fabricating a semiconductor structure in accordance with another methodological embodiment of the invention. This other methodological embodiment of the invention comprises a second methodological embodiment of the invention. FIG. 12 shows a schematic cross-sectional diagram of the semiconductor structure at an early stage in the fabrication thereof in accordance with this other methodological embodiment of the invention.

FIG. 12 shows a semiconductor structure that corresponds generally with the semiconductor structure of FIG. 6, but wherein a mask layer 26' is substituted for the mask layer 26. The mask layer 26' may comprise materials and be formed using methods that are analogous, equivalent or identical to the materials and methods that are used in conjunction with the mask layer 26. However, the lateral dimensions of the mask layer 26' are such that an aperture B defined by the mask layer 26' is narrower than the aperture A defined by the mask layer 26 that is illustrated in FIG. 5. Typically, the aperture B has a linewidth from about 0.05 to about 0.12 microns while (as disclosed above) the aperture A has a linewidth from about 0.08 to about 0.15 microns.

Figure 13:
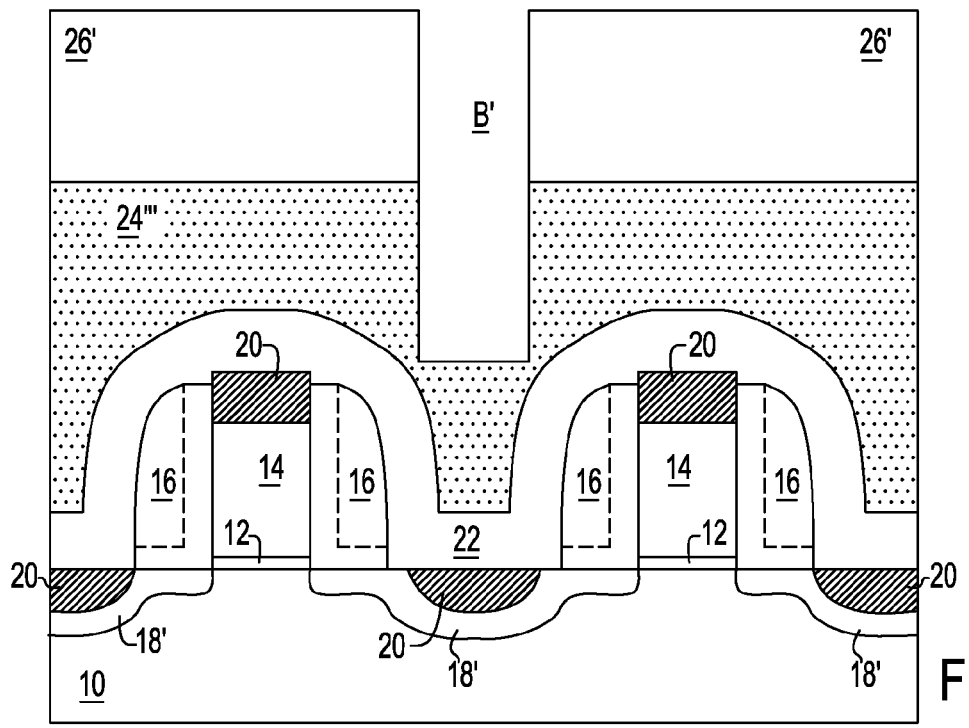

FIG. 13 shows a passivation layer 24''' that results from etching the passivation layer 24 while using the mask layer 26' as a mask. The etching yields an extended aperture B' from the aperture B. The etching may be undertaken using methods and materials that are conventional in the semiconductor fabrication art. Included again are wet chemical etch methods and materials, and dry plasma etch methods and materials. Dry plasma etch methods and materials are again particularly common insofar as dry plasma etch methods and materials provide for straight sidewalls of the extended aperture B'.

Figure 14:
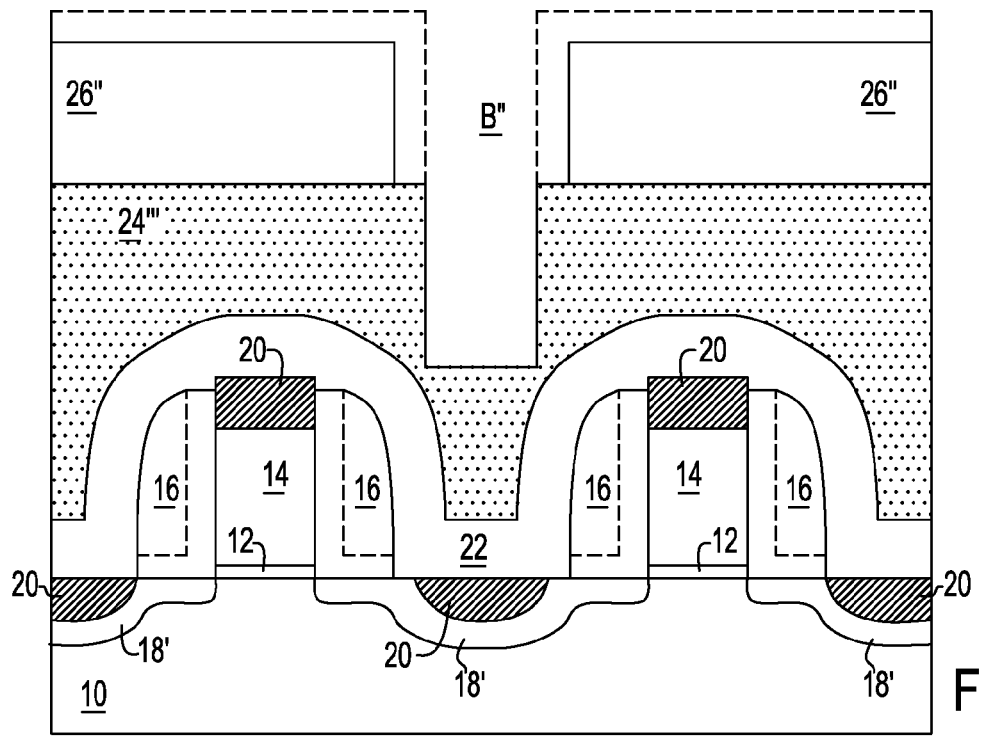

FIG. 14 shows a mask layer 26'' that results from shrinking of the mask layer 26' that is illustrated in FIG. 13. The shrinking provides an enlarged aperture B'' from the extended aperture B' that is illustrated in FIG. 13. Shrinking of the mask layer 26' to form the mask layer 26'' may be effected using methods and materials that are conventional in the semiconductor fabrication art. Non-limiting examples include photoexposure induced shrinking methods and materials, thermal exposure induced shrinking methods and materials and chemical induced shrinking methods and materials. Preferably, the mask layer 26' is shrunk to provide the mask layer 26'' while using an acidic solution that comprises acid compounds such as hydrochloric acid or hydrofluoric acid.

Figure 15:
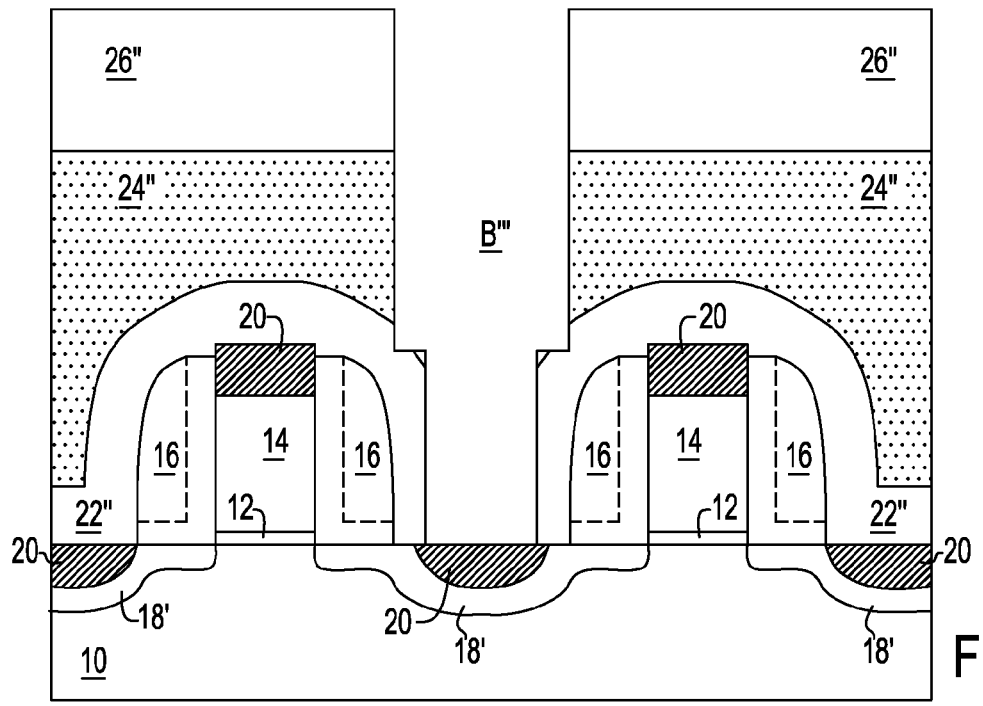

FIG. 15 shows the results of etching the passivation layer 24''' while using the mask layer 26'' as a mask to form the same (or at least nominally analogous or equivalent) passivation layer 24'' and liner layer 22'' that are illustrated in FIG. 10. The mask layer 26', the passivation layer 24'' and the liner layer 22'' bound an enlarged and elongated aperture B''' that is formed from the elongated aperture B'' that is illustrated in FIG. 14. The semiconductor structure that is illustrated in FIG. 15 may be further fabricated to provide the semiconductor structure that is illustrated in FIG. 11 after having stripped the mask layer 26'' from the semiconductor structure of FIG. 15.

FIG. 15 shows a schematic cross-sectional diagram of a semiconductor structure related to the semiconductor structure in accordance with FIG. 10. The semiconductor structure in accordance with FIG. 15 is fabricated using a separate and different method that complements the method that is used to fabricate the semiconductor structure of FIG. 10. Particularly, this additional method uses a two step etch method that includes forming a comparatively narrow aperture within the passivation layer 24''' and then enlarging and elongating the comparatively narrow aperture to form a narrow bottomed stepped sidewall contact aperture, rather than forming a comparatively wide aperture and then narrowly coaxially elongating the comparatively wide aperture to form the narrow bottomed stepped sidewall contact aperture.

Figure 16:
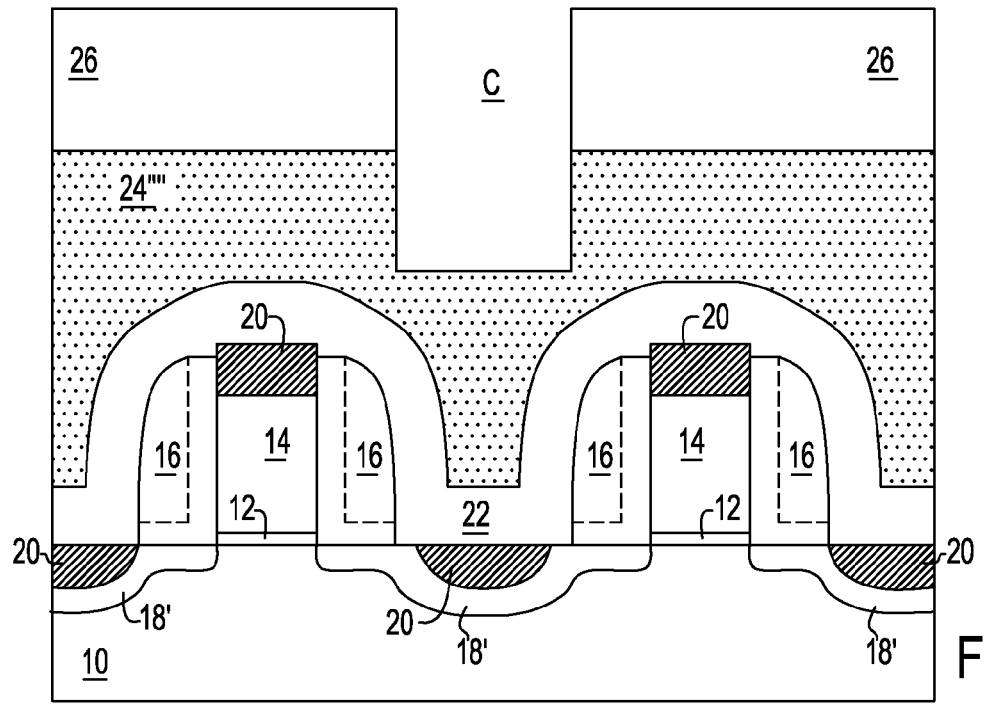
FIG. 16 to FIG. 19 show a series of schematic cross-sectional diagrams illustrating the results of progressive stages in fabricating the semiconductor structure in accordance with the structural embodiment of the invention, while using yet another particular method that comprises yet another particular methodological embodiment of the invention.

FIG. 16 to FIG. 19 illustrate the results of progressive stages in fabricating a semiconductor structure in accordance with the structural embodiment of the invention, within the context of yet another methodological embodiment of the invention. This yet another methodological embodiment of the invention comprises a third methodological embodiment of the invention. FIG. 16 shows a schematic cross-sectional diagram of the semiconductor structure at an early stage in the fabrication thereof in accordance with this yet another methodological embodiment of the invention.

FIG. 16 corresponds with FIG. 6, but with an aperture C defined by the mask layer 26 and a passivation layer 24'''' rather than an aperture A' defined by the mask layer 26 and the passivation layer 24' that is illustrated in FIG. 6.

Figure 17:
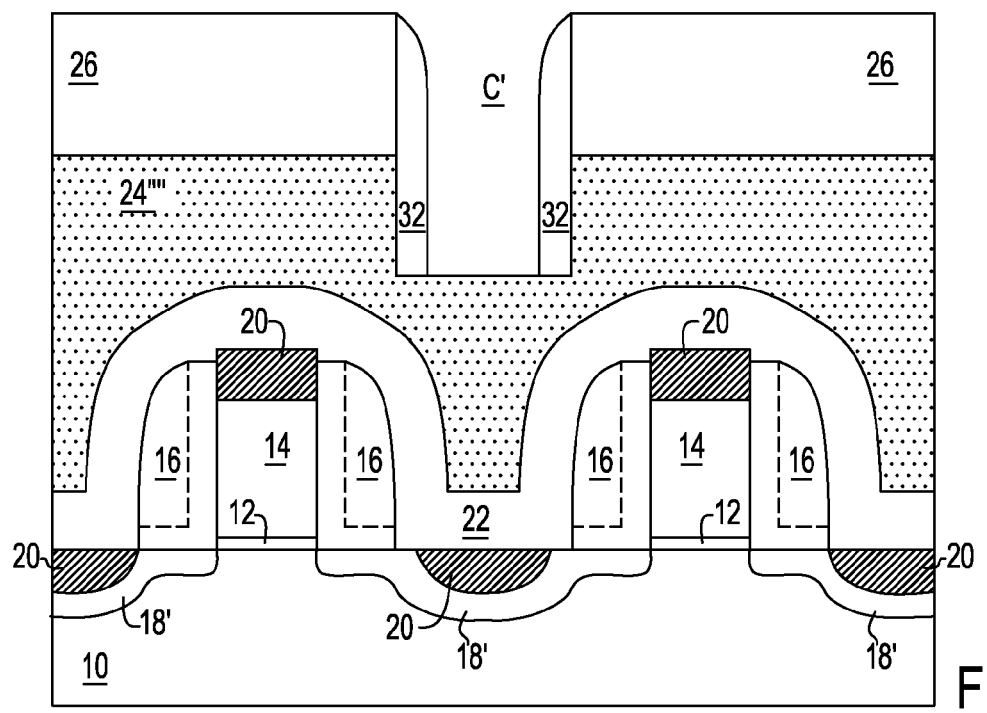

FIG. 17 shows a spacer 32 located adjoining sidewall portions of the passivation layer 24'''' and the mask layer 26. Although the spacer 32 is illustrated as a plurality of layers in cross-section, the spacer 32 is intended as a single layer annularly surrounding sidewall portions of the passivation layer 24'''' and mask layer 26 to form a narrowed aperture C' from the aperture C that is illustrated in FIG. 16.

The spacer 32 may be formed using a blanket layer deposition and anisotropic etchback method that is otherwise generally conventional in the semiconductor fabrication art. Typically, the spacer 32 comprises a material that may be selectively etched in comparison with the material from which is comprised the passivation layer 24''''. Thus, when the passivation layer 24'''' typically comprises a silicon oxide material, the spacer 32 typically comprises other than a silicon oxide material, and more preferably a silicon nitride material.

Figure 18:
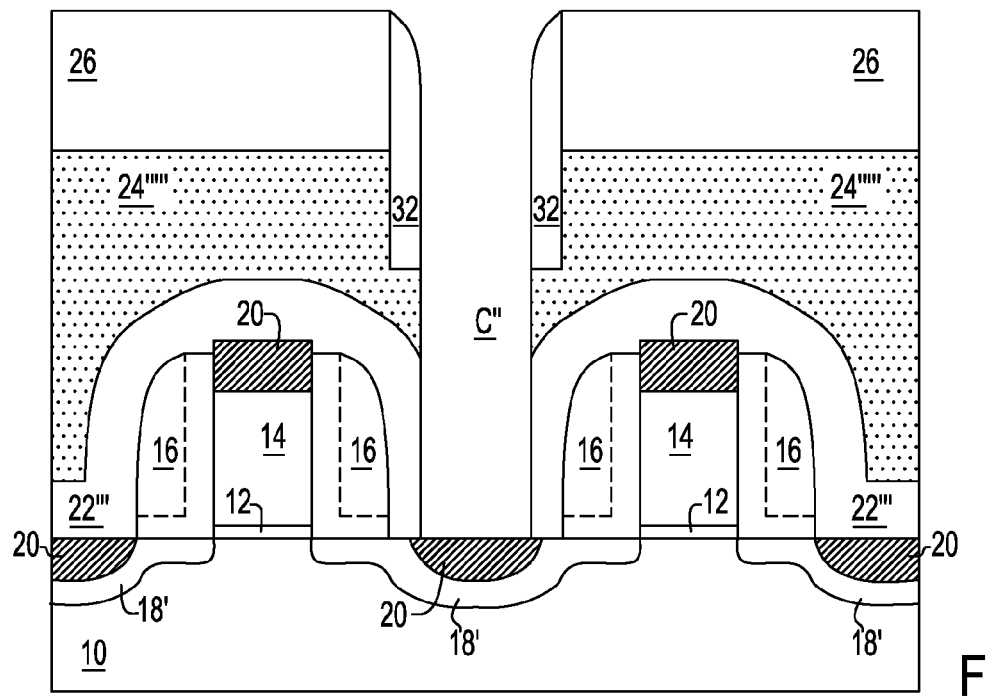

FIG. 18 shows the results of etching the passivation layer 24'''' to form a passivation layer 24''''' and etching the liner layer 22 to form a liner layer 22'''. The passivation layer 24''''' and the liner layer 22''' bound an elongated aperture C'' that exposes the silicide layer 20 located upon the middle source/drain region 18'.

Figure 19:
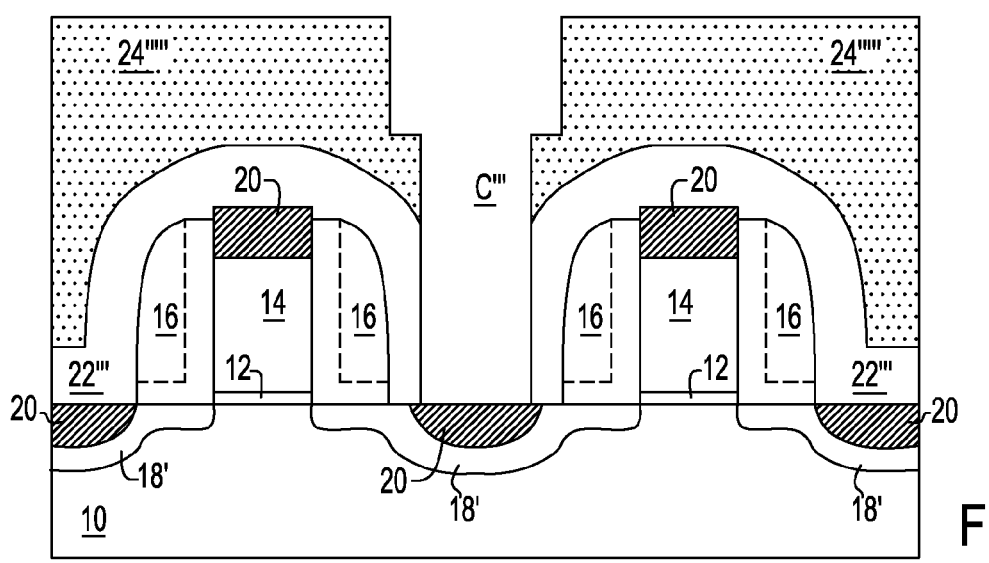

FIG. 19 shows the results of stripping the mask layer 26 and the spacer 32 from the semiconductor structure of FIG. 18, to thus form a narrow bottomed stepped sidewall contact aperture C''' generally in accordance with the above embodiments. The semiconductor structure of FIG. 19 may be further fabricated while using methods and materials that are conventional in the semiconductor fabrication art to yield a semiconductor structure analogous to the semiconductor structure whose schematic cross-sectional diagram is illustrated in FIG. 11. Such a semiconductor structure also provides the advantages described above for the semiconductor structure of FIG. 11.

The semiconductor structure and methods for fabrication thereof in accordance with the preferred embodiments are illustrative of the invention rather than limiting of the invention. Revisions and modifications may be made to methods, materials, structures and dimensions for fabricating a semiconductor structure in accordance with the preferred embodiments, while still providing a semiconductor structure or method for fabrication thereof in accordance with the invention, further in accordance with the accompanying claims.

What is claimed is:

1. A method for fabricating a semiconductor structure comprising:
    forming a dielectric liner having a conformal thickness atop a semiconductor structure, said semiconductor structure including a device region and a contact region formed over a substrate;
    forming a passivation layer atop said dielectric liner;
    forming upon the passivation layer a mask layer having a first aperture of a first width formed therein;
    extending the first aperture into the passivation layer stopping on the dielectric liner, while using the mask layer as a first etch mask;
    forming a reacted material layer upon a sidewall surface and a top surface of the mask layer to form a second aperture having a narrower width than the first aperture, said forming the reacted material layer comprises:
        forming a reactive material layer upon the mask layer and into the first aperture that is present in the passivation layer;

reacting by thermal activation the reactive material layer with the mask layer to form a partially reacted reactive material layer; and stripping unreacted portions of the partially reacted reactive material layer to form the reacted material layer upon the sidewall surface and the top surface of the mask layer;

etching the dielectric liner using the reacted material layer as an etch mask to extend the second aperture into the dielectric liner until the contact region is exposed to provide a via with a stepped sidewall; and forming a conductive material within the via having the stepped sidewall.

2. A method for fabricating a semiconductor structure comprising:

forming a dielectric liner having a conformal thickness atop a semiconductor structure, said semiconductor structure including a device and contact regions formed over a substrate forming a passivation layer atop said dielectric liner;

forming upon the passivation layer a mask layer having a first aperture of a first width formed therein;

extending the first aperture into the passivation layer stopping on the dielectric liner, while using the mask layer as a first etch mask;

forming a reacted material layer upon a sidewall and top surface of the mask layer to form a second aperture having a narrower width then the first aperture; and etching the dielectric liner using the reactive material layer as an etch mask to extend the second aperture into the dielectric liner until the contact regions are exposed to provide a via with a stepped sidewall.

3. The method of claim 2 further comprising forming a conductive material within the via having the stepped sidewall.

4. The method of claim 2 wherein the forming the reacted material layer includes:

forming a reactive material layer upon the mask layer and into the first aperture that is present in the passivation layer;

reacting the reactive material layer with the mask layer to form a partially reacted reactive material layer; and stripping unreacted portions of the partially reacted reactive material layer to form the reacted material layer upon the mask layer.

5. The method of claim 2 wherein the reacting the reactive material layer uses a thermal activation.

6. The method of claim 2 wherein the reacting the reactive material layer uses a photo activation.

7. The method of claim 2 wherein the forming the reacted material layer uses a chemical reaction between a mask material from which is formed the mask layer and a reactive material from which is formed the reactive material layer.

8. A method for fabricating a semiconductor structure comprising:

forming a dielectric liner having a conformal thickness atop a semiconductor structure, said semiconductor structure including a device and contact regions formed over a substrate;

forming a passivation layer atop said dielectric liner; and forming a contact via having a stepped sidewall through the passivation layer and said dielectric liner to expose the contact region, in which an upper portion of the contact via is present in the passivation layer and is in contact with only an upper surface of the dielectric liner, and the lower portion of the contact via is present in the dielectric liner, in which the lower portion of the contact via has a lesser width than the upper portion of the contact via, wherein the forming of the contact via uses either:

a two step etch method that uses a single photoresist layer with or without shrinkage of the single photoresist layer; or a two step etch method that uses a single photoresist layer with or without a self aligned spacer.

9. The method of claim 8 further comprising filling the contact via having the stepped sidewall contact aperture with a conductor material selected from the group consisting of doped silicon, conducting metal, metal silicide, and metal nitride conductor materials.

10. The method of claim 8 wherein the forming the contact via with the stepped sidewall includes etching the upper portion of the contact via within the passivation layer stopping on the dielectric liner.

11. The method of claim 8 wherein the forming the contact via having the stepped sidewall includes etching the lower portion of the contact via into the dielectric liner.

* * * * *